US009439336B2

(12) United States Patent
Yokomae et al.

(10) Patent No.: US 9,439,336 B2
(45) Date of Patent: Sep. 6, 2016

(54) COMPONENT MOUNTING SYSTEM

(71) Applicant: PANASONIC INTELLECTUAL PROPERTY MANAGEMENT CO., LTD., Osaka (JP)

(72) Inventors: Takahiro Yokomae, Yamanashi (JP); Nobuya Matsuo, Yamanashi (JP); Teruaki Nishinaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/538,224

(22) Filed: Nov. 11, 2014

(65) Prior Publication Data

US 2015/0135524 A1 May 21, 2015

(30) Foreign Application Priority Data

Nov. 15, 2013 (JP) .................................. 2013-236424

(51) Int. Cl.
*G08B 21/00* (2006.01)
*H05K 13/08* (2006.01)
*G08B 21/18* (2006.01)
*H05K 13/04* (2006.01)

(52) U.S. Cl.
CPC ............. *H05K 13/08* (2013.01); *G08B 21/187* (2013.01); *H05K 13/04* (2013.01); *Y10T 29/53087* (2015.01)

(58) Field of Classification Search
CPC ............ G08B 21/187; G05B 19/4065; G05B 2219/37357; H05K 13/08; H05K 13/04; H05K 13/0069; H05K 13/02; H05K 13/028; H05K 13/043; H05K 13/0404; Y10T 29/53087; G07C 3/00

USPC .......... 340/540, 679, 680, 681; 29/720, 739; 235/285; 70/83
See application file for complete search history.

(56) References Cited

U.S. PATENT DOCUMENTS

| 2008/0078834 A1* | 4/2008 | Woodward | H05K 13/08 235/385 |
| 2011/0203106 A1* | 8/2011 | Tanaka | H05K 13/0452 29/720 |
| 2012/0062727 A1* | 3/2012 | Kaida | H05K 13/0465 348/87 |

FOREIGN PATENT DOCUMENTS

| JP | 2013-030641 A | 2/2013 |
| JP | 2013-214754 | 10/2013 |

* cited by examiner

*Primary Examiner* — Anh V La
(74) *Attorney, Agent, or Firm* — Pearne & Gordon LLP

(57) ABSTRACT

In a component mounting system, a portable operation terminal is wirelessly connectable to mounting machines. The portable operation terminal includes: a processing portion which displays a screen allowing a worker to select one of the mounting machines to be connected to the portable operation terminal; and a terminal-side connection processing portion which issues a connection request to the selected mounting machine and which connects the portable operation terminal to the mounting machine upon reception of an acknowledgement from the mounting machine. The mounting machine includes: an equipment-side connection processing portion which connects the mounting machine to the portable operation terminal in response to the connection request, and a notification unit which notifies the worker of the fact that the mounting machine has been connected to the portable operation terminal, directly by at least one of sound and light.

6 Claims, 10 Drawing Sheets

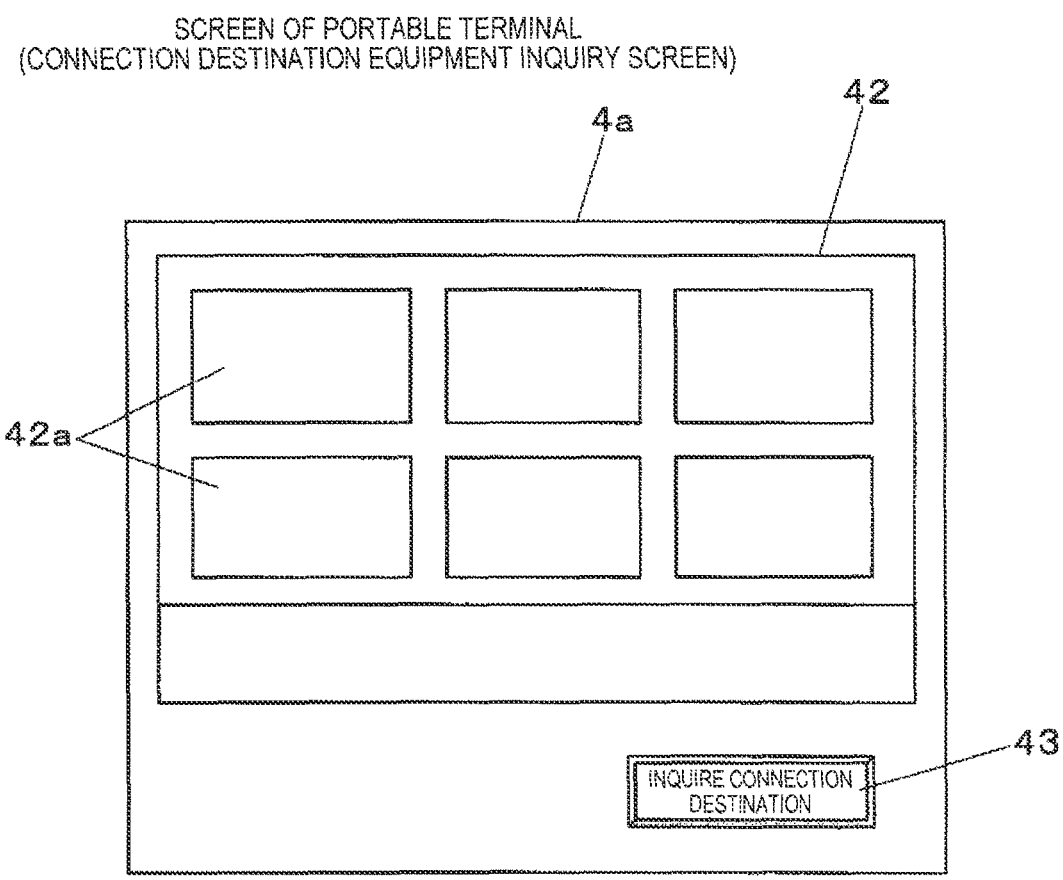

COMPONENT MOUNTING SYSTEM

BACKGROUND

1. Technical Field

An aspect of the present invention relates to a component mounting system which includes mounting machines used for mounting components and a portable operation terminal wirelessly connectable to the mounting machines.

2. Background Art

There is a component mounting system in which mounting machines used for mounting components are linked to one another, as component mounting equipment for executing a work for mounting electronic components on substrates such as circuit substrates or liquid crystal substrates. Each of these mounting machines is provided with a control portion for controlling a component mounting mechanism which executes a component mounting work and an operation portion for performing a necessary operation input to the control portion. The operation portion includes a display panel displaying an operation screen, operation switches, etc. In the component mounting system, in place of a method in which the worker gains access to the operation portion of the mounting machine to directly perform an operation input thereon, there is a method in which a worker performs an operation input on the operation portion of one of the mounting machines through a portable operation terminal such as a tablet PC capable of making radio communication with the mounting machine (for example, see JP-A-2013-030641). According to the example described in JP-A-2013-030641, display/input screens of a plurality of devices as targets to be operated are displayed on the tablet PC. In this manner, display functions/input functions of the plurality of devices can be performed from the tablet PC so that there is an advantage that operability can be improved.

SUMMARY

However, in the example described in JP-A-2013-030641, there is a problem relevant to safety as follows. That is, since the portable operation terminal such as the tablet PC can be connected to any of the targets to be operated through radio communication, the worker can operate any of the mounting machines from any position. For this reason, misconnection may be incurred to connect the portable operation terminal to an unintended mounting machine other than the mounting machine which should be operated. Even in the case where misconnection has occurred, it is not easy for the worker to sense this situation. As a result, operation is continued under the misconnection to incur an insecure operation. Thus, there is a problem that a countermeasure against the misconnection or the insecure operation is insufficient in the system in which each of the mounting machines can be operated from the portable operation terminal through radio communication in the background art.

An object of aspects of the invention is to provide a component mounting system which can solve the foregoing problem when one of mounting machines is operated from a portable operation terminal through radio communication.

According to an aspect of the invention, there is provided a component mounting system including: a plurality of mounting machines which are used for mounting components; and a portable operation terminal which is wirelessly connectable to the plurality of mounting machines, so as to allow the portable operation terminal to operate one of the mounting machines which has been connected to the portable operation terminal, wherein the portable operation terminal includes: a terminal-side operation input unit including a display portion and an operation portion which are integrated with each other; a processing portion which displays, on the display portion, a screen which allows a worker operating the plurality of mounting machines to select one of the mounting machines to be connected to the portable operation terminal; and a terminal-side connection processing portion which issues a connection request to the mounting machine selected on the screen and which connects the portable operation terminal to the mounting machine upon reception of an acknowledgement from the mounting machine as a destination of the connection request, and wherein each of the plurality of mounting machines includes: an equipment-side connection processing portion which connects the mounting machine to the portable operation terminal in response to the connection request, and a notification unit which notifies the worker of the fact that the mounting machine has been connected to the portable operation terminal, directly by at least one of sound and light.

According to another aspect of the invention, there is provided a component mounting system including: a plurality of mounting machines which are used for mounting components; and a portable operation terminal which is wirelessly connectable to the plurality of mounting machines, so as to allow the portable operation terminal to operate one of the mounting machines which has been connected to the portable operation terminal, wherein the portable operation terminal includes an inquiry operation portion which allows a worker to inquire the mounting machine which has been connected to the portable operation terminal, and wherein each of the plurality of mounting machines includes a notification unit which notifies the worker of a location of the mounting machine, directly by at least one of sound and light in response to the inquiry.

According to aspects of the invention, a connection request is issued to one of the mounting machines selected by an operation on the screen of the portable operation terminal in which the display portion and the operation portion are integrated with each other. Upon reception of an acknowledgement from the mounting machine as the destination of the connection request, the portable operation terminal connects itself to the mounting machine. On the other hand, the selected mounting machine sends the acknowledgement of the connection request and connects itself to the portable operation terminal. In such a configuration, the worker can be notified of the fact that the mounting machine has been connected to the portable operation terminal, directly by sound or light. Further, the inquiry operation portion which the worker may operate in order to inquire the mounting machine connected to the portable operation terminal is provided so that the worker can be notified of the location of the mounting machine directly by sound or light in response to the inquiry. Thus, it is possible to avoid misconnection or an insecure operation when the worker operates any of the mounting machines from the portable operation terminal through radio communication.

BRIEF DESCRIPTION OF THE DRAWINGS

FIG. 10 is a view showing a screen displayed on the portable operation terminal in the coupling process in the component mounting system according to the embodiment of the invention.

DETAILED DESCRIPTION

Figure 1:
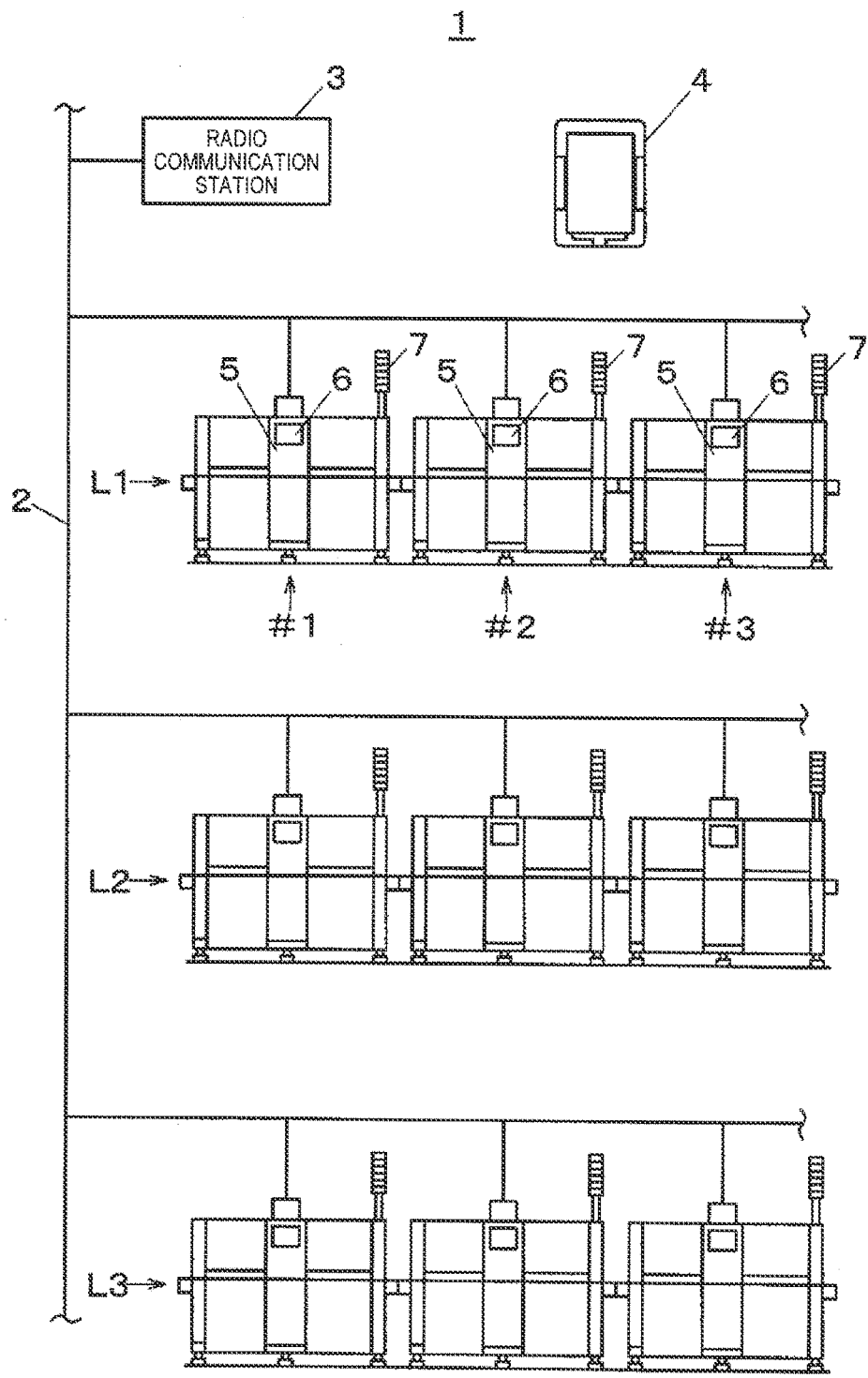
FIG. 1 is a view for describing the configuration of a component mounting system according to an embodiment of the invention.

An embodiment of the invention will be described below with reference to the drawings. First, the configuration of a component mounting system 1 will be described with reference to FIG. 1. In FIG. 1, the component mounting system 1 has a function of mounting electronic components on substrates to manufacture mounted boards. The component mounting system 1 is constituted by a plurality of component mounting lines L1, L2, L3 . . . in each of which a plurality of pieces of component mounting equipment used for mounting components are linked. These pieces of component mounting equipment are connected to one another through a communication network 2. The communication network 2 includes a radio communication station 3. These pieces of component mounting equipment can be connected through radio communication to a tablet PC 4 serving as a portable operation terminal. Here, only the mounting machines #1, #2, #3 . . . for mounting electronic components on substrates in the component mounting lines L1, L2, L3 . . . are illustrated while the other pieces of component mounting equipment are not illustrated.

Each of the mounting machines #1, #2, #3 . . . is provided with an operation/input portion 11 (see FIG. 2) and a signal device 7. The operation/input portion 11 includes an operation panel 5 provided with operation switches, a display panel 6 provided with touch panel switches, etc. When a worker who is in charge of component mounting management and maintenance of the component mounting system 1 performs various operations on each device, the worker may operate any of the mounting machines #1, #2, #3 . . . directly through their operation/input portions 11. Alternatively the worker may operate any of the mounting machines #1, #2, #3 . . . connected to the tablet PC 4 carried by the worker, by remote control from the tablet PC.

Figure 2:
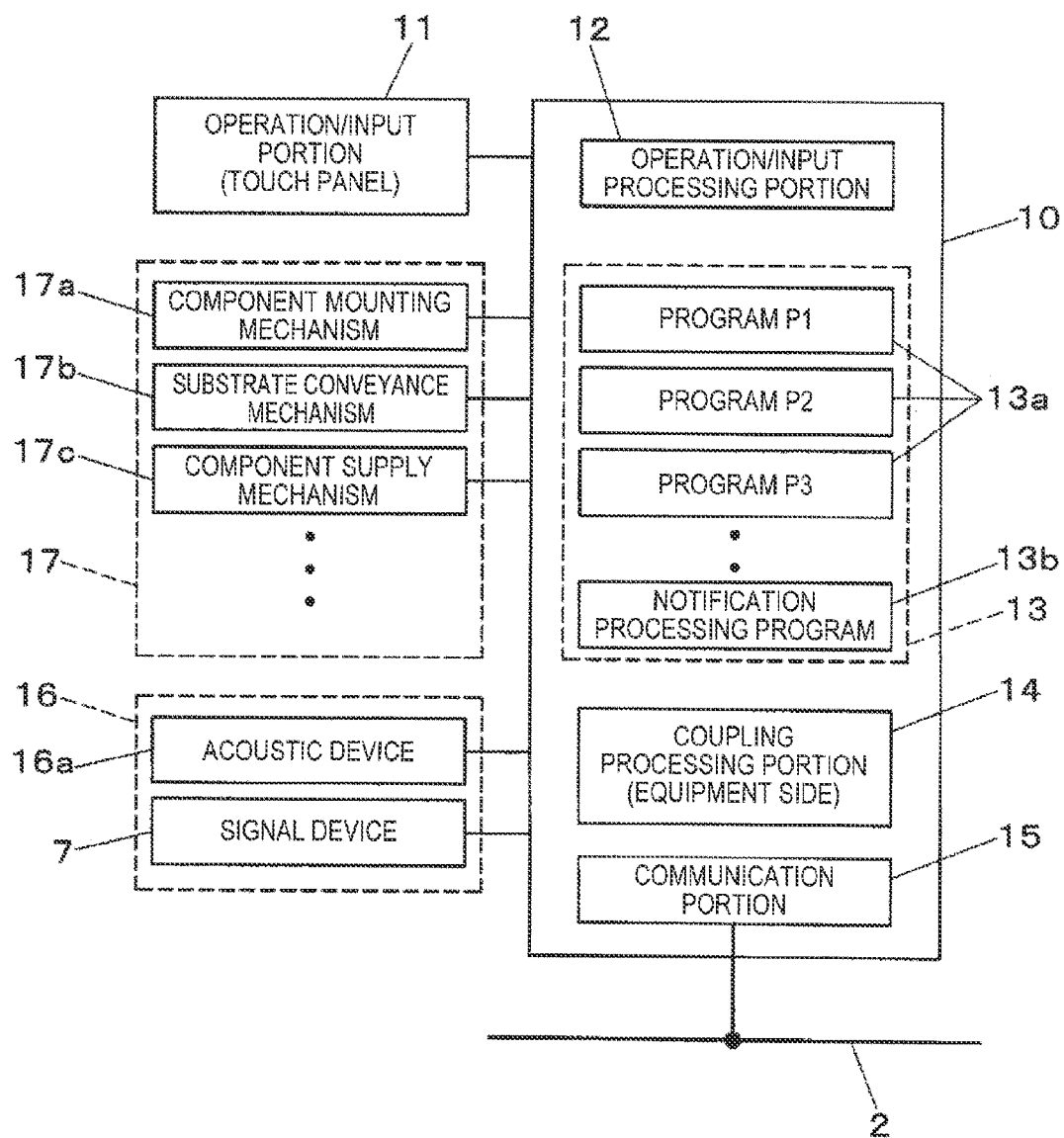
FIG. 2 is a block diagram showing the configuration of a mounting machine in the component mounting system according to the embodiment of the invention.

Next, the configuration of the mounting machine #1, #2 or #3 will be described with reference to FIG. 2. In FIG. 2, the mounting machine #1, #2 or #3 has a configuration in which a working portion 17 and a reporting portion 16 are controlled by a control unit 10 to which the operation/input portion 11 including the display panel 6 etc. is connected. The working portion 17 includes a component mounting mechanism 17a, a substrate conveyance mechanism 17b, a component supply mechanism 17c, etc. for executing various works to mount electronic components on substrates.

The reporting portion 16 is controlled by the control unit 10 to perform various kinds of reporting. For example, the reporting portion 16 performs a reporting process to report a failure having occurred in the mounting machine to the worker through an acoustic device 16a or the signal device 7. That is, the acoustic device 16a gives a predetermined report to the worker by means of a sound or audible signal from a speaker, a buzzer, etc. In addition, the signal device 7 gives a predetermined report to the worker by means of a visual signal using blinking light, color light etc. of a signal lamp. In the embodiment, the reporting function of the reporting portion 16 is used to directly notify the worker of the fact that the mounting machine has been connected. In addition, when the worker wants to confirm which mounting machine has been connected, the reporting function of the reporting portion 16 can be also used to directly notify the worker of the location of the mounting machine in response to an inquiry from the worker.

The control unit 10 includes an operation/input processing portion 12, a control processing portion 13, a coupling processing portion (equipment side) 14, and a communication portion 15. The control processing portion 13 includes a plurality of programs 13a and a notification processing program 13b. Each of the programs 13a is a work program for executing a function originally provided by the mounting machine. In addition, the notification processing program 13b is a program for executing a notification process to directly notify every worker of a predetermined content by use of the reporting function of the reporting portion 16 and the display portion of the operation/input portion 11 so that the predetermined content can be known to the worker.

The control processing portion 13 controls the working portion 17 in accordance with the programs 13a so as to execute a mounting work for mounting electronic components on circuit substrates, a substrate conveyance work for conveying the circuit substrates, a component supply work for supplying electronic components, etc. The control processing portion 13 controls the reporting portion 16 in accordance with the notification processing program 13b so as to execute a coupling notification process to notify the worker of the fact that the mounting machine has been connected, directly by sound using the acoustic device 16a or by light using the signal device 7.

Accordingly, the notification processing portion, which is a processing function achieved by the control processing portion 13 executing the notification processing program 13b, and the reporting portion 16 constitute a notification unit which notifies the worker of the fact that the mounting machine has been connected, directly by at least one of sound and light. In the embodiment, the acoustic device 16a or the signal device 7 which is originally provided as a reporting unit used for reporting a failure having occurred in the mounting machine to the worker may be included in the notification unit. Incidentally, the coupling notification process may be performed by the aforementioned notification processing portion so as to be displayed on the operation/input portion 11 serving as the display portion provided in the mounting machine. That is, in this case, the aforementioned notification unit may be formed to include the operation/input portion 11 serving as the display portion provided in the mounting machine.

When such a coupling notification process is executed, the worker can surely visually recognize the mounting machine as a target to be operated by remote control from the tablet PC in a production site where a plurality of component mounting lines each having a plurality of mounting machines linked to one another are disposed. Thus, it is possible to effectively prevent the worker from performing a mistaken operation which may result in an improper operation performed in a state in which the tablet PC has been connected to a wrong mounting machine, which originally should not be connected, due to a mistake of the worker. Particularly the signal device 7 can be lit at the time of the coupling notification. Thus, the mounting machine as the target to be operated can be confirmed visually even from a remote position. There is a remarkable effect in improvement of workability particularly in a production site having a plurality of mounting lines.

When the worker operates the operation/input portion 11, a control operation signal is inputted to the control unit 10 and the inputted control operation signal is issued as a predetermined control command to the control processing portion 13 by the operation/input processing portion 12. That is, the operation/input portion 11 and the operation/input processing portion 12 serve as an equipment-side operation input unit for performing an operation input to the control processing portion 13.

Figure 4:
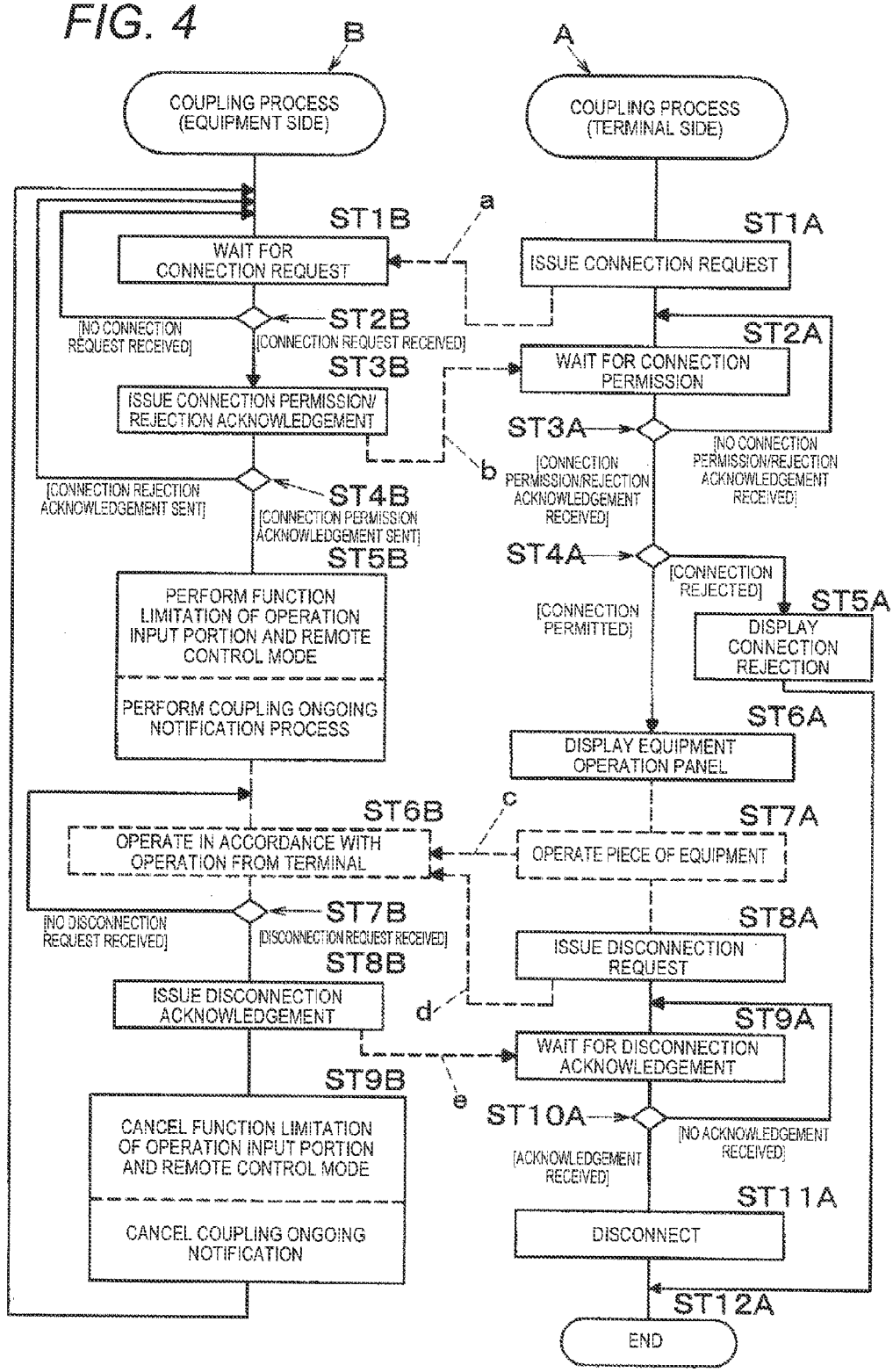
FIG. 4 is a flow chart showing a coupling process between the mounting machine and the portable operation terminal in the component mounting system according to the embodiment of the invention.

The coupling processing portion (equipment side) 14 is an equipment-side connection processing portion which executes a coupling process (equipment side) for connecting the aforementioned equipment-side operation input unit and the tablet PC 4 to each other (see FIG. 4). The communication portion 15 is a communication interface which can exchange a cable signal with another piece of equipment through the communication network 2 or exchange a radio signal with the tablet PC 4 through the radio communication station 3 connected to the communication network 2.

Figure 3:
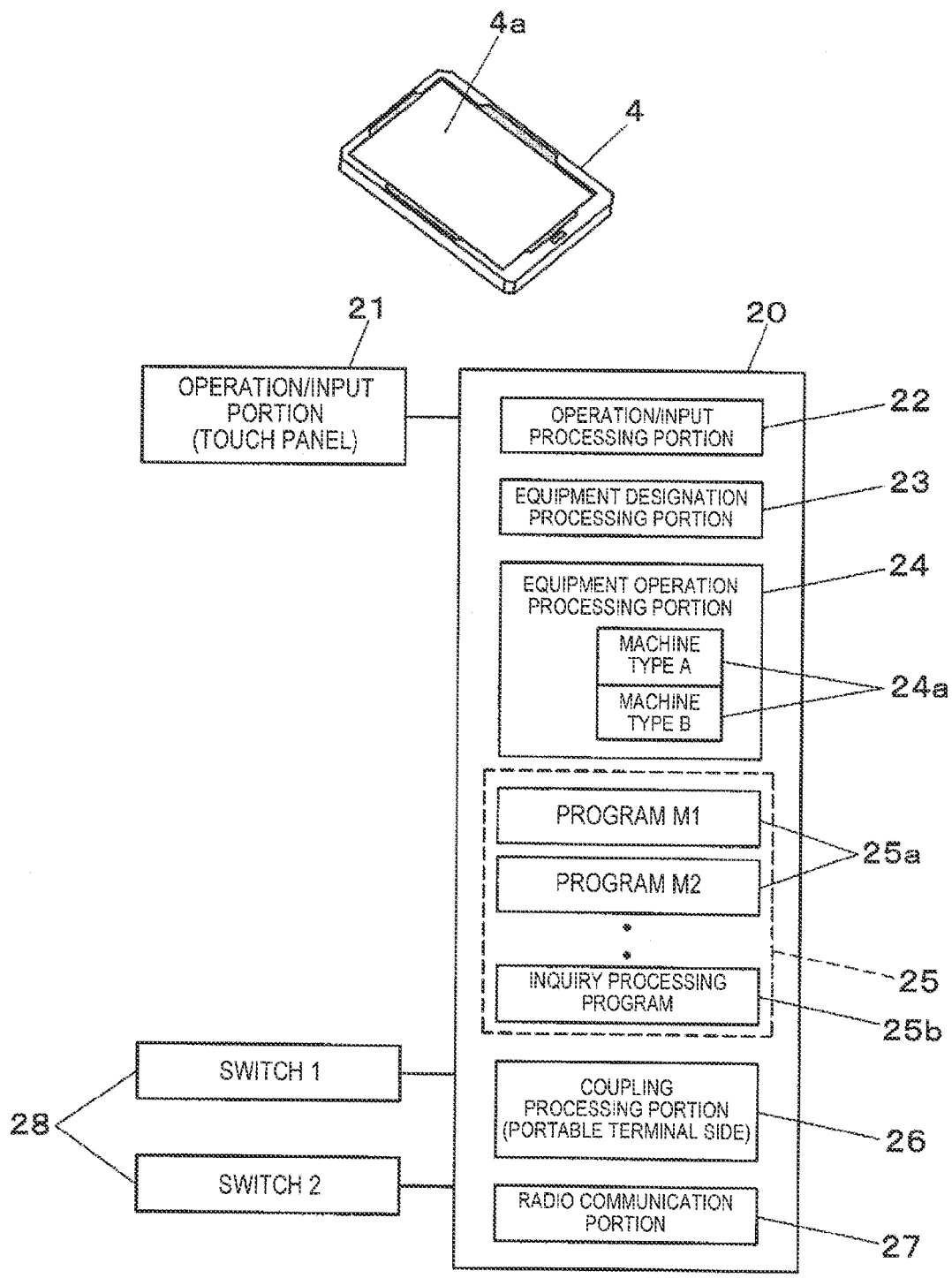
FIG. 3 is a block diagram showing the configuration of a portable operation terminal in the component mounting system according to the embodiment of the invention.

Next, the configuration of the tablet PC 4 will be described with reference to FIG. 3. In FIG. 3, the tablet PC 4 is a tablet type terminal in which a touch panel type operation/input portion 21 as an operation portion is built in a display/operation screen 4a as a display portion. External operation type switches 28 are additionally provided to a body portion of the tablet PC 4. A processing unit 20 including an operation/input processing portion 22, an equipment designation processing portion 23, an equipment operation processing portion 24, a control processing portion 25, a coupling processing portion (portable terminal side) 26 and a radio communication portion 27 is built in the body portion of the tablet PC 4.

When the tablet PC 4 functions as an ordinary tablet terminal, the worker may touch and operate the display/operation screen 4a. Thus, an operation signal is inputted to the operation/input processing portion 22 by the function of the operation/input portion 21 and the inputted operation signal is issued as a predetermined operation command to the control processing portion 25 by the operation/input processing portion 22.

When the tablet PC 4 functions as a terminal for operating a piece of equipment which has been connected to the tablet PC 4 by the coupling process, the worker may touch and operate the display/operation screen 4a. Thus, an operation signal is inputted to the equipment operation processing portion 24 by the function of the operation/input portion 21.

Based on the operation signal, the equipment operation processing portion 24 generates a control command for the piece of equipment. The radio communication portion 27 outputs the generated control command. The control command outputted from the radio communication portion 27 is issued to the control processing portion 13 of the piece of equipment through the radio communication station 3 and the communication network 2.

That is, the operation/input portion 21 and the operation/input processing portion 22 serve as a terminal-side operation input unit in which a display portion and an operation portion are integrated with each other. The terminal-side operation input unit performs an operation input to the equipment designation processing portion 23 and the equipment operation processing portion 24. Incidentally, although an example in which the tablet PC 4 is used as the portable operation terminal is shown here, a terminal device such as a notebook-type personal computer in which a display panel as a display portion and a keyboard, a mouse, etc. as an operation portion are assembled integrally may be used alternatively.

The equipment operation processing portion 24 displays an equipment operation screen on the display/operation screen 4a serving as the display portion. The equipment operation screen is used for operating corresponding one of the mounting machines #1, #2, #3 . . . as the pieces of component mounting equipment. In addition, the equipment operation processing portion 24 performs an equipment operation process to make the aforementioned terminal-side operation input unit serve as a unit for performing an operation input to the corresponding mounting machine. In order to allow a plurality of different machine types to be operated, machine type data 24a about operation screen information and control commands are stored in the equipment operation processing portion 24 in accordance with each of the machine types. The equipment operation processing portion 24 is set to generate only some required ones of the control commands which can be used in the mounting machines #1, #2, #3 . . . . In this manner, operation items which can be operated from the tablet PC 4 are limited to some required ones of the operation items which can be operated by the equipment-side operation input unit.

The equipment designation processing portion 23 performs a process of designating one mounting machine selected from the plurality of mounting machines #1, #2, #3 . . . as a mounting machine which will be connected to the tablet PC 4 and set as a target to be operated and inputted by remote control from the tablet PC 4. That is, which mounting machine #1, #2, #3 . . . will be set as a target to be connected is designated by an equipment designation screen (see FIG. 5) displayed on the display/operation screen 4a. The equipment operation processing portion 24 displays, on the tablet PC 4, an equipment operation screen for executing a component mounting work in the mounting machine designated by the equipment designation processing portion 23. That is, the equipment operation processing portion 24 serves as a processing portion which displays a screen on the display/operation screen 4a serving as the display portion in order to allow the worker operating the plurality of mounting machines #1, #2, #3 . . . to select one mounting machine which will be connected to the tablet PC 4.

The control processing portion 25 performs a control process to enable the tablet PC 4 to execute its original functions. That is, when various programs 25a built in the control processing portion 25 are executed in accordance with operation commands inputted from the operation/input portion 21 or the switches 28, various functions as the tablet PC 4, such as an arithmetic function, a communication function and an imaging function, can be achieved. Further, an inquiry processing program 25b is built in the control processing portion 25. When the inquiry processing program 25b is executed, an inquiry for identifying and confirming the mounting machine which has been connected to the tablet PC can be performed. This inquiry process can be executed by the worker who operates a connection destination inquiry button 43 (see FIG. 10) provided in the display/operation screen 4a serving as the operation/input portion 21.

That is, the tablet PC in the embodiment has a mode in which the connection destination inquiry button 43 is provided as an inquiry operation portion which the worker may operate in order to inquire the mounting machine which has been connected to the tablet PC. According to a mode used in a specific example, the tablet PC 4 includes the operation/input portion 21 constituting the terminal-side operation input unit in which the display portion and the operation portion are integrated with each other, and the connection destination inquiry button 43 as the inquiry operation portion is displayed on the display/operation screen 4a as the display portion belonging to the operation/input portion 21. It is a matter of course that the connection destination inquiry button 43 may be provided as an external button in the body portion of the tablet PC 4.

Correspondingly to the aforementioned function, a notification unit for notifying the worker who has operated the connection destination inquiry button 43 (the inquiry operation portion) of the tablet PC, of the location of the mounting machine in response to the inquiry from the tablet PC is provided in each of the plurality of mounting machines as targets to be inquired. The acoustic device 16a or the signal device 7 of the reporting portion 16 can be used as the notification unit similarly to the configuration in the coupling notification for notifying the worker of the fact that the mounting machine has been connected. The notification unit also serves as a reporting unit used for reporting a failure having occurred in the mounting machine to the worker.

The coupling processing portion (portable terminal side) 26 is a terminal-side connection processing portion which exchanges a signal with the coupling processing portion (equipment side) 14 belonging to the equipment side to thereby execute a coupling process (terminal side) for connecting the equipment operation processing portion 24 to the piece of component mounting equipment (corresponding one of the mounting machines #1, #2, #3 . . . ) designated as a target to be operated and inputted (see FIG. 4). That is, the coupling processing portion 26 issues a connection request to the mounting machine selected by an on-screen operation on the display/operation screen 4a and connects the tablet PC to the mounting machine as the destination of the connection request upon reception of an acknowledgement from the mounting machine. The coupling processing portion 14 (equipment-side connection processing portion) belonging to the corresponding one of the plurality of mounting machines #1, #2, #3 . . . sends back an acknowledgement of the aforementioned connection request and connects the mounting machine to the tablet PC as the source of the connection request.

In this connection status, an operation input to the control processing portion 13 of the mounting machine from the tablet PC 4 is allowed so that the mounting machine can be operated by remote control from the tablet PC 4. On the other hand, operation inputs for the operation items which can be performed by the equipment-side operation input unit in the mounting machine are basically prohibited except for some operation items. In this manner, for example, another worker who has not been notified of the fact that remote control is being performed can be prevented from gaining access to the mounting machine to perform an improper operation input by mistake to result in an insecure status. The radio communication portion 27 is a radio communication module which can exchange a radio signal with any of the mounting machines #1, #2, #3 . . . through the radio communication station 3 connected to the communication network 2.

A coupling process for connecting the tablet PC 4 and one of the mounting machines #1, #2, #3 . . . to each other in the component mounting system 1 will be described with reference to the flow chart of FIG. 4 and FIGS. 5 to 10. In this coupling process, a coupling process (terminal side) A performed in the tablet PC 4 carried by the worker and a coupling process (equipment side) B performed in one of the mounting machines #1, #2, #3 . . . as the destination of the connection request are executed in parallel by exchanging signals between the tablet PC 4 and the mounting machine through radio communication.

Figure 5:
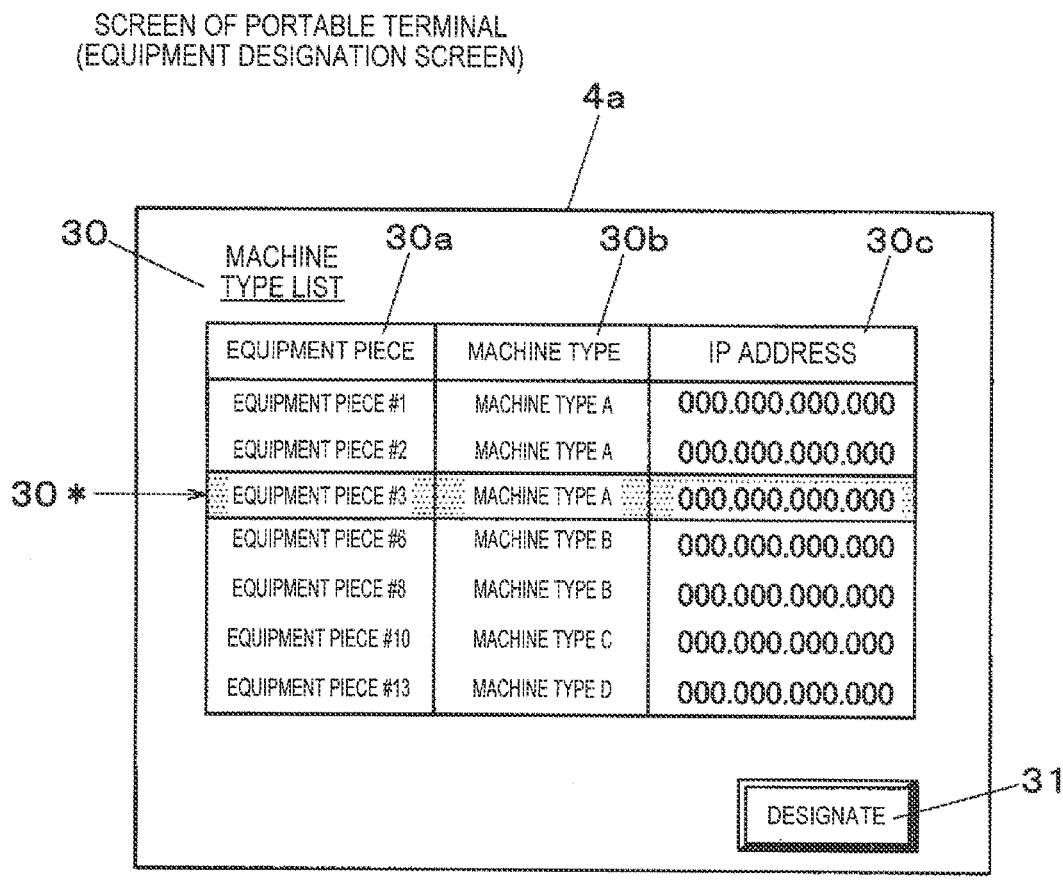
FIG. 5 is a view showing a screen displayed on the portable operation terminal in the coupling process in the component mounting system according to the embodiment of the invention.

When the coupling process starts, an equipment designation screen shown in FIG. 5 is first displayed on the display/operation screen 4a of the tablet PC 4. In this manner, a machine type list 30 indicating a list of pieces of equipment which can be set as targets to be connected in the component mounting system 1 is displayed on the display/operation screen 4a. "Equipment piece" entries 30a each using a unique number etc. to identify a piece of equipment, "machine type" entries 30b each indicating a component mounting machine type of the piece of equipment, and "IP address" entries 30c each used for identifying the piece of equipment when the tablet PC 4 and the mounting machine communicate with each other are defined in machine type list 30.

Figure 6:
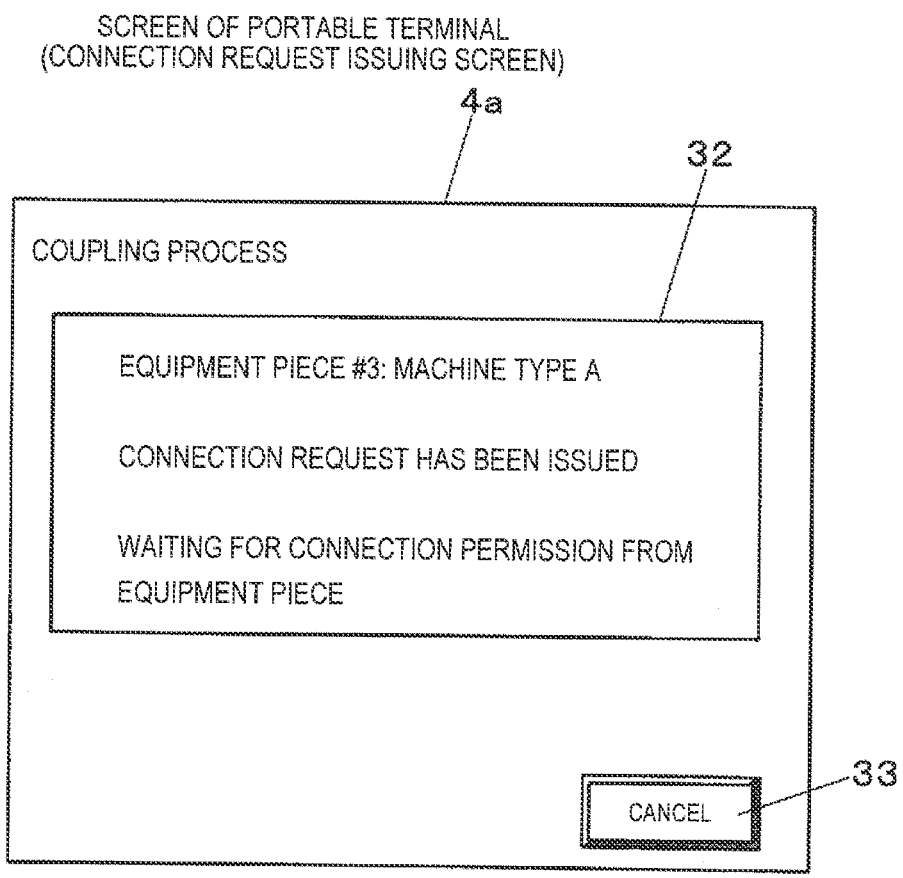
FIG. 6 is a view showing a screen displayed on the portable operation terminal in the coupling process in the component mounting system according to the embodiment of the invention.

To designate a piece of equipment, a designated equipment piece 30* (the mounting machine #3 in this case) which will be set as the target to be connected is selected from the "equipment piece" entries 30a displayed in the machine type list 30 and a designation operation button 31 is operated. In this manner, a coupling process shown in FIG. 4 is started. That is, a connection request in which the equipment piece designated on the equipment designation screen shown in FIG. 5 is set as the target is issued (ST1A), and a connection request issuing screen as shown in FIG. 6 is displayed on the display/operation screen 4a.

Here, a message indicating that the connection request has been issued to the mounting machine #3 which is a machine type A is displayed in a message frame 32. Incidentally, when a cancellation operation button 33 for cancelling the connection request is operated, the coupling process is interrupted. The tablet PC 4 waits for connection permission (ST2A) following the issuing of the connection request and monitors whether a connection permission/rejection acknowledgement has been acquired from the target piece of equipment or not (ST3A).

Figure 8:
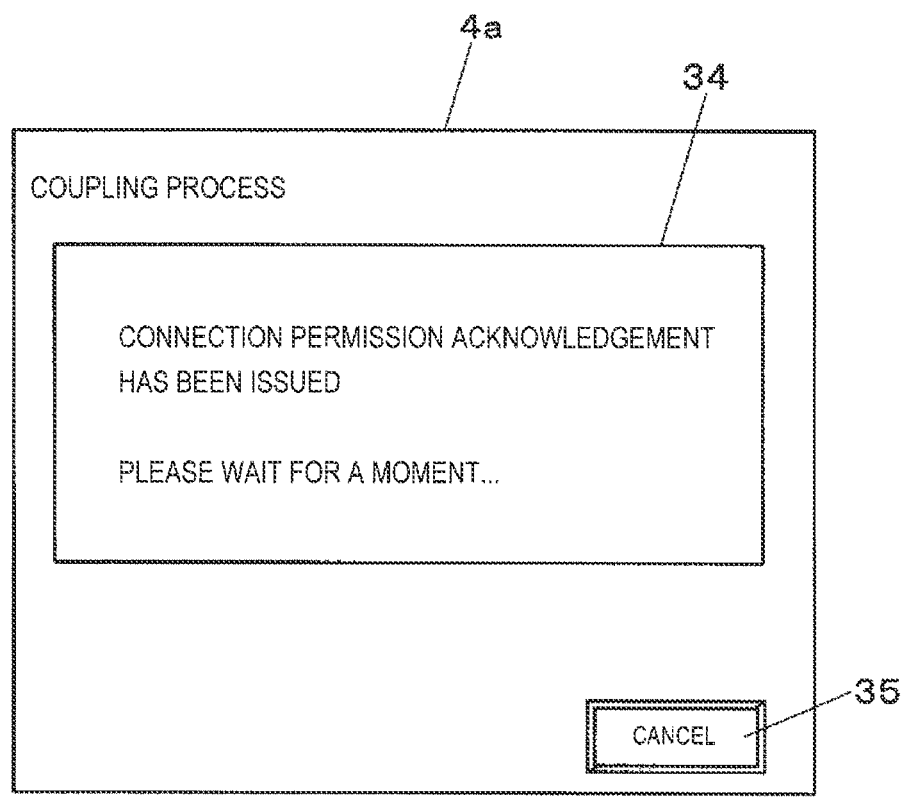
FIG. 8 is a view showing a screen displayed on the mounting machine in the coupling process in the component mounting system according to the embodiment of the invention.

On this occasion, the mounting machines #1, #2, #3 . . . always wait for a connection request (ST1B) and monitor whether the connection request has been received or not (ST2B). Here, when the connection request issued in (ST1A) is received (arrow "a") in (ST1B), [connection request received] is confirmed in (ST2B). In response thereto, a connection permission acknowledgement is issued (arrow "b") in (ST3B). Thus, a connection permission acknowledgement screen including a message frame 38 indicating that the connection permission acknowledgement has been issued is displayed on the display panel 6 of the piece of equipment, as shown in FIG. 8. Incidentally, a cancellation operation button 39 may be operated to cancel the process without issuing the connection permission acknowledgement.

Figure 7:
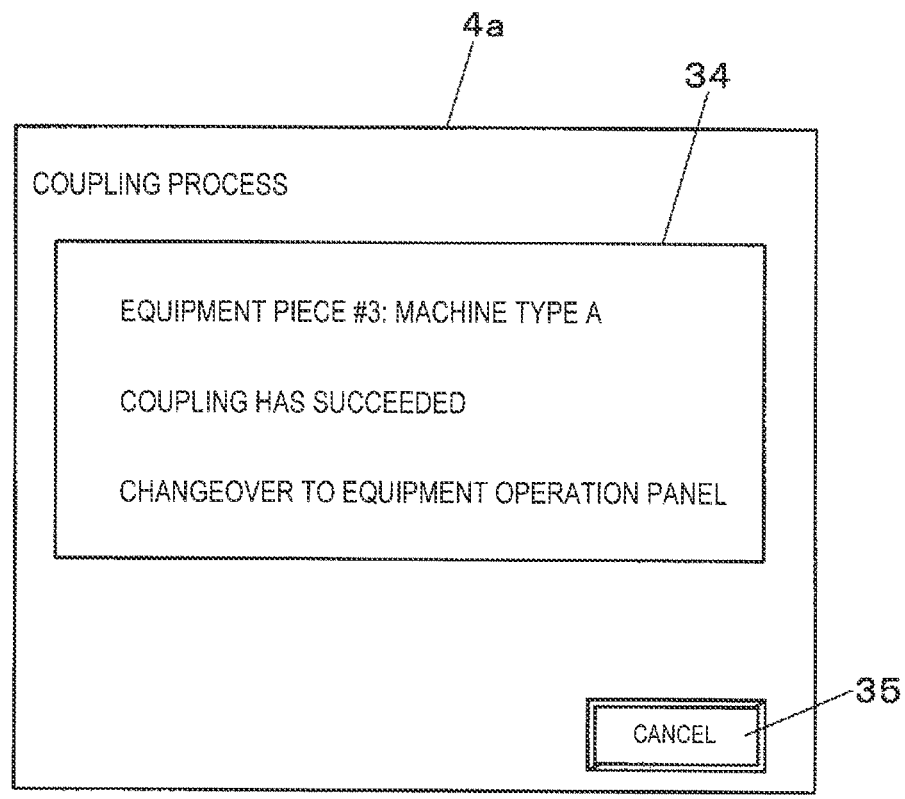
FIG. 7 is a view showing a screen displayed on the portable operation terminal in the coupling process in the component mounting system according to the embodiment of the invention.

When reception of the acknowledgement is confirmed in (ST3A) by the tablet PC 4 and determination is further made as [connection permitted] in (ST4A), an equipment operation panel changeover screen shown in FIG. 7 is displayed on the display/operation screen 4a of the tablet PC 4 (ST6A). A message frame 34 reporting that the coupling with the target piece of equipment (the mounting machine #3 which is a machine type A in this case) has succeeded and the display screen of the display/operation screen 4a can be changed over to the operation panel for operating the piece of equipment is displayed on the equipment operation panel changeover screen. Incidentally, a cancellation operation button 35 may be operated not to continue the coupling process but to cancel it.

When the connection permission acknowledgement is received thus, an equipment operation panel which should be displayed on the display panel 6 of the target piece of equipment in a normal state is displayed on the display/operation screen 4a of the tablet PC 4. Thus, the worker can perform remote control (ST7A) on the target piece of equipment through the tablet PC 4.

Figure 9:
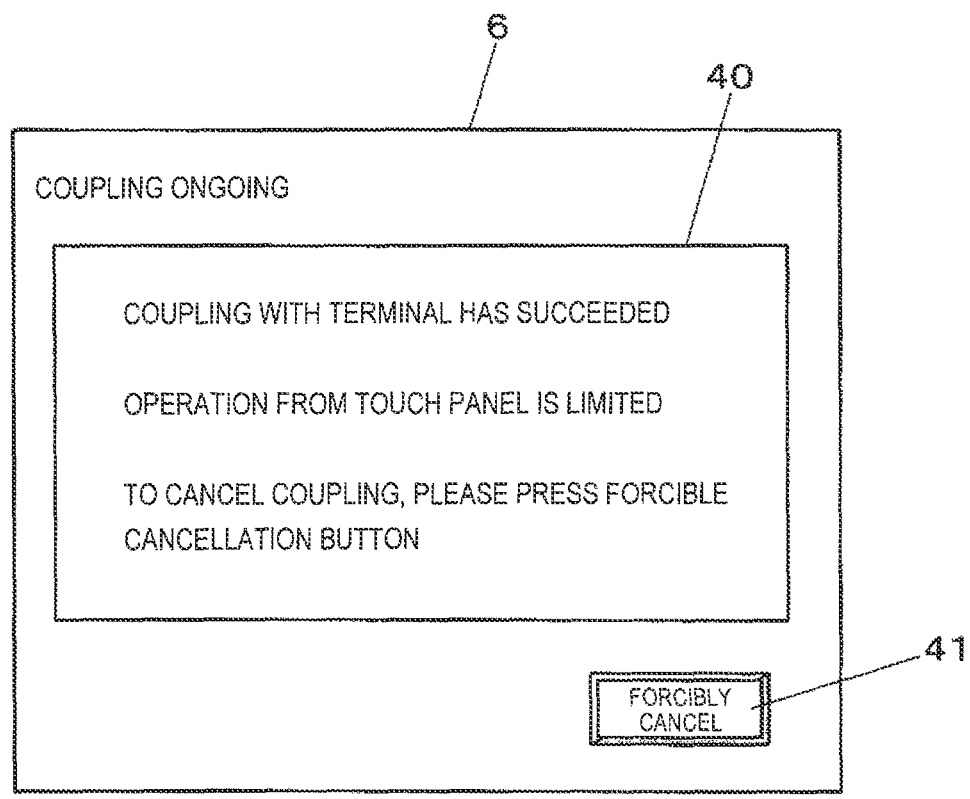
FIG. 9 is a view showing a screen displayed on the mounting machine in the coupling process in the component mounting system according to the embodiment of the invention.

When [connection permission acknowledgement sent] is confirmed in (ST4B), function limitation of the operation input portion and a remote control mode are set and a coupling ongoing notification process indicating that the mounting machine is in a connection status to the tablet PC is executed (ST5B). The worker is notified of the coupling ongoing notification process directly by at least one of sound and light such as a method of blowing buzzer sound with a predetermined pattern by the acoustic device 16a and a method of lighting the signal device 7. A message frame 40 indicating that the coupling between the tablet PC 4 and the mounting machine has succeeded and operation from the display panel 6 of the piece of equipment is limited is displayed on the display panel 6 of the piece of equipment, as shown in FIG. 9. Incidentally, a forcible cancellation button 41 may be operated to cancel the coupling.

Here, the function limitation of the operation input portion means that operations from the display panel 6 or the operation panel 5 of the piece of equipment are limited to operations relevant to some functions (such as emergency stop, cancellation of the connection status, etc.). In addition, the remote control mode means that the piece of equipment can be operated from the tablet PC 4. In the remote control mode, functions of the piece of equipment which can be operated from the tablet PC 4 are limited to the functions of the piece of equipment limited by the function limitation of the operation input portion. In this manner, it is possible to eliminate a possible improper operation in which, when the worker is performing an operation input to the piece of equipment from the tablet PC 4, another person performs another different operation input to the piece of equipment from the operation portion of the piece of equipment. Accordingly, it is possible to avoid a trouble which may be caused by the piece of equipment performing another operation unintended by the worker who is operating the piece of equipment from the tablet PC 4.

After the coupling status has been achieved thus, the piece of equipment can be operated through the tablet PC 4 in (ST7A). In this manner, an operation command is transmitted to the piece of equipment as the coupling target (arrow "c"), and the piece of equipment operates in accordance with the operation from the tablet PC 4 based on the remote control mode (ST6B) and monitors whether a disconnection request has been received from the tablet PC 4 or not (ST7B).

On the other hand, when determination is made that connection is rejected and [connection rejection acknowledgement sent] is confirmed in (ST4B), the piece of equipment is restored to the state prior to (ST1B). When the tablet PC 4 confirms reception of the connection rejection acknowledgement in (ST3A) and further determines [connection rejected] in (ST4A), the connection rejection is displayed on the display/operation screen 4a of the tablet PC 4 (ST5A). Then, the coupling process is terminated (ST12A).

In the state in which determination is made that connection is permitted in (ST4A) and (ST4B) and the tablet PC and the mounting machine have been connected to each other through radio communication, the worker carrying the tablet PC may want to confirm the location of the mounting machine as the connection destination for some reason. In such a case, the worker displays a connection destination equipment inquiry screen shown in FIG. 10 on the display/operation screen 4a of the tablet PC. Both an operation display area 42 in which a plurality of operation buttons 42a for operating the mounting machines are set and a connection destination inquiry button 43 are displayed on display/operation screen 4a. When the worker operates the connection destination inquiry button 43, the notification processing program 13b shown in FIG. 2 is executed in the mounting machine as the connection destination to operate the acoustic device 16a or the signal device 7 provided in the reporting portion 16 of the mounting machine. In this manner, the worker who has performed the inquiry operation through the tablet PC can easily identify the mounting machine as the connection destination even when the mounting machine as the connection destination is disposed at a remote location.

When it is not necessary to continue the connection between the tablet PC 4 and the mounting machine any longer in the process of operating the mounting machine through the tablet PC 4, the worker issues a disconnection request to the mounting machine through the tablet PC 4 (ST8A) (arrow "d"). Thus, the tablet PC 4 waits for a disconnection acknowledgement from the equipment side (ST9A) and monitors whether an acknowledgement signal has been received or not (ST10A).

When the disconnection request issued in (ST8A) is confirmed and determination is made as [disconnection request received] in (ST7B), the equipment side issues a disconnection acknowledgement (ST8B) and transmits (arrow "e") the disconnection acknowledgement to the tablet PC 4 which is waiting for the disconnection acknowledgement (ST9A). Thus, the equipment side is released from the function limitation of the operation input portion and the remote control mode and a coupling ongoing notification cancellation process for cancelling the coupling ongoing notification indicating that the mounting machine is in a connection status to the tablet PC is executed (ST9B). In the coupling ongoing notification cancellation process, the notification started in (ST5B) by use of the acoustic device 16a or the signal device 7 and sent to the worker is cancelled and then the piece of equipment returns to the state prior to (ST1B). When the tablet PC 4 determines [acknowledgement received] in (ST10A), the connection between the tablet PC 4 and the piece of equipment is cancelled (ST11A). Then, the coupling process is terminated (ST12A).

That is, in the aforementioned coupling process, the coupling processing portion (portable terminal side) 26 serving as the terminal-side connection processing portion transmits a connection request signal (arrow "a") for making a connection request to the coupling processing portion (equipment side) 14 serving as the equipment-side connection processing portion. The coupling processing portion (equipment side) 14 transmits a connection permission signal (arrow "b") to the coupling processing portion (portable terminal side) 26 in response to the connection request signal in accordance with predetermined conditions. Thus, the tablet PC 4 and the target mounting machine are connected to each other. In this connection status, an operation input to the control processing portion 13 of the mounting machine from the tablet PC 4 is allowed to be executed by remote control from the tablet PC 4, and an operation input in a predetermined range is prohibited from being performed by the operation/input portion 11 of the mounting machine.

As described above, in the embodiment, a connection request is issued to one mounting machine selected by an operation on the display/operation screen 4a serving as the terminal-side operation input portion (the operation/input portion 21 and the operation/input processing portion 22) in which the display portion and the operation portion are integrated with each other. Upon reception of an acknowledgement from the mounting machine as the destination of the connection request, the tablet PC connects itself to the mounting machine. On the other hand, the selected mounting machine issues the acknowledgement of the connection request and connects itself to the tablet PC. In this configuration, a worker can be notified of the fact that the mounting machine has been connected, directly by sound or light. Further, the inquiry operation portion which the worker may operate in order to inquire which mounting machine is in a connection status to the tablet PC is provided in the display/operation screen 4a of the tablet PC so that the worker can be notified of the location of the mounting machine directly by sound or light in response to the inquiry.

Thus, in a production site in which a plurality of component mounting lines each having a plurality of mounting machines linked to one another are disposed, a worker can surely visually recognize one mounting machine set as a target to be operated by remote control from the tablet PC. Accordingly, it is possible to effectively prevent the worker from performing a mistaken operation which may result in an improper operation performed in a state in which the tablet PC has been connected to a wrong mounting machine, which originally should not be connected, due to a mistake of the worker, and it is possible to achieve operability and safety simultaneously.

In addition, when operations which can be performed by the equipment-side operation input unit are limited to operations relevant to some functions in the connection status, it is possible to avoid a trouble which may be caused by another person who operates the equipment-side operation input unit at the time of the remote control mode to make the piece of equipment perform another operation unintended by the worker who is operating the piece of equipment through the portable operation terminal.

Incidentally, in the embodiment, the mounting machines #1, #2, #3 . . . as the plurality of pieces of component mounting equipment are designed to be able to be connected to one another through the communication network 2 and make radio communication with the tablet PC 4 through the radio communication station 3 provided in the communication network 2. However, configuration may be made alternatively so that the communication network 2 and the radio communication station 3 are not required elements but the mounting machines can individually make radio communication directly with the tablet PC 4. In addition, linkage of the plurality of mounting machines is not always necessary so that the invention can be also applied to the case where radio communication is made between one single mounting machine and the tablet PC 4.

In addition, it is preferable that the equipment operation screen displayed on the display/operation screen 4a by the equipment operation processing portion 24 is identical to the equipment operation screen displayed on the display panel 6 of the mounting machine which has been connected to the tablet PC 4. However, these two equipment operation screens are not necessarily identical to each other in the invention.

The component mounting system according to the embodiment of the invention has an effect that operability and safety can be achieved simultaneously when a mounting machine is operated from the portable operation terminal through radio communication. The component mounting system according to the embodiment of the invention is useful in the field of mounting electronic components on substrates by use of mounting machines.

What is claimed is:

1. A component mounting system comprising:
a plurality of mounting machines which are used for mounting components; and
a portable operation terminal which is wirelessly connectable to the plurality of mounting machines, so as to allow the portable operation terminal to operate one of the mounting machines which has been connected to the portable operation terminal,
wherein the portable operation terminal comprises:
a terminal-side operation input unit comprising a display portion and an operation portion which are integrated with each other;
a processing portion which displays, on the display portion, a screen which allows a worker operating the plurality of mounting machines to select one of the mounting machines to be connected to the portable operation terminal; and
a terminal-side connection processing portion which issues a connection request to the mounting machine selected on the screen and which connects the portable operation terminal to the mounting machine upon reception of an acknowledgement from the mounting machine as a destination of the connection request, and
wherein each of the plurality of mounting machines comprises:
an equipment-side connection processing portion which connects the mounting machine to the portable operation terminal in response to the connection request, and
a notification unit which notifies the worker of the fact that the mounting machine has been connected to the portable operation terminal, directly by at least one of sound and light.

2. The component mounting system according to claim 1, wherein the notification unit comprises a display portion provided in each of the mounting machines.

3. The component mounting system according to claim 1, wherein the notification unit comprises a reporting unit which is used for reporting, to the worker, a failure having occurred in the mounting machine.

4. A component mounting system comprising:
a plurality of mounting machines which are used for mounting components; and a portable operation terminal which is wirelessly connectable to the plurality of mounting machines, so as to allow the portable operation terminal to operate one of the mounting machines which has been connected to the portable operation terminal, wherein the portable operation terminal comprises an inquiry operation portion which allows a worker to inquire the mounting machine which has been connected to the portable operation terminal, and wherein each of the plurality of mounting machines comprises a notification unit which notifies the worker of a location of the mounting machine, directly by at least one of sound and light in response to the inquiry.

5. The component mounting system according to claim 4, wherein the portable operation terminal further comprises a terminal-side operation input unit which comprises a display portion and an operation portion which are integrated with each other, and wherein the inquiry operation portion is displayed on the display portion.

6. The component mounting system according to claim 4, wherein the notification unit also serves as a reporting unit which is used for reporting, to the worker, a failure having occurred in the mounting machine.

* * * * *